United States Patent
Tamboli et al.

(10) Patent No.: US 7,977,121 B2
(45) Date of Patent: Jul. 12, 2011

(54) METHOD AND COMPOSITION FOR RESTORING DIELECTRIC PROPERTIES OF POROUS DIELECTRIC MATERIALS

(75) Inventors: Dnyanesh Chandrakant Tamboli, Breinigsville, PA (US); Madhukar Bhaskara Rao, Fogelsville, PA (US); Mark Leonard O'Neill, Allentown, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 840 days.

(21) Appl. No.: 11/601,486

(22) Filed: Nov. 17, 2006

(65) Prior Publication Data
US 2008/0118995 A1 May 22, 2008

(51) Int. Cl.
*H01L 21/00* (2006.01)
(52) U.S. Cl. ............... 438/4; 438/694; 438/787
(58) Field of Classification Search ............. 438/4, 694, 438/787
See application file for complete search history.

(56) References Cited

U.S. PATENT DOCUMENTS

| | | | |
|---|---|---|---|
| 5,470,802 | A | 11/1995 | Gnade et al. |
| 5,504,042 | A | 4/1996 | Cho et al. |
| 5,804,508 | A | 9/1998 | Gnade et al. |
| 6,037,277 | A * | 3/2000 | Masakara et al. ............ 438/787 |
| 6,140,252 | A | 10/2000 | Cho et al. |
| 6,312,793 | B1 | 11/2001 | Grill et al. |
| 6,372,666 | B1 | 4/2002 | Ramos et al. |
| 6,503,850 | B1 | 1/2003 | Wallace et al. |
| 6,559,071 | B2 | 5/2003 | Ramos et al. |
| 6,890,391 | B2 | 5/2005 | Aoki et al. |
| 6,972,083 | B2 * | 12/2005 | Desai et al. .................... 205/782 |
| 7,000,621 | B1 | 2/2006 | Verhaverbeke |
| 7,074,727 | B2 | 7/2006 | Hsu et al. |
| 7,385,231 | B2 * | 6/2008 | Fujimoto et al. .............. 257/121 |
| 7,468,330 | B2 * | 12/2008 | Allen et al. .................... 438/780 |
| 7,485,611 | B2 * | 2/2009 | Roeder et al. ................. 510/175 |
| 7,500,397 | B2 * | 3/2009 | Weigel et al. .................... 73/714 |
| 2003/0055134 | A1 * | 3/2003 | Yim et al. ........................ 524/48 |
| 2003/0159713 | A1 | 8/2003 | Park et al. |

(Continued)

FOREIGN PATENT DOCUMENTS

EP     0 775 669 A2    5/1997

(Continued)

OTHER PUBLICATIONS

Ishikawa et al "Influence of CMP Chemicals on the Properties of Porous Silica Low-k Films" Journal of the Electrochemical Society 153 (7) G692-696 (May 22, 2006).*

(Continued)

*Primary Examiner* — Laura M Menz
(74) *Attorney, Agent, or Firm* — Lina Yang

(57) ABSTRACT

The present invention provides a method for restoring the dielectric properties of a porous dielectric material. The method comprises providing a substrate comprising at least one layer of a porous dielectric material comprising a contaminant comprising at least one entrapped liquid having a surface tension, wherein the porous dielectric material comprising the at least one contaminant has a first dielectric constant. The substrate is contacted with a restoration fluid comprising water and at least one compound having a surface tension that is less than the surface tension of the at least one entrapped liquid in the at least one layer of a porous dielectric material. Upon drying, the porous dielectric material has a second dielectric constant that is lower than the first dielectric constant and all constituents of the restoration fluid are removed upon drying.

15 Claims, 4 Drawing Sheets

U.S. PATENT DOCUMENTS

| | | | |
|---|---|---|---|
| 2003/0178047 A1 | 9/2003 | Hirae | |
| 2004/0013858 A1 | 1/2004 | Hacker et al. | |
| 2004/0069625 A1* | 4/2004 | Desai et al. | 204/400 |
| 2004/0074526 A1 | 4/2004 | Aoki et al. | |
| 2004/0175942 A1* | 9/2004 | Chang et al. | 438/689 |
| 2004/0198066 A1 | 10/2004 | Verhaverbeke | |
| 2004/0224865 A1* | 11/2004 | Roeder et al. | 510/175 |
| 2005/0076580 A1* | 4/2005 | Tamboli et al. | 51/307 |
| 2005/0205835 A1* | 9/2005 | Tamboli et al. | 252/79.1 |
| 2006/0081273 A1* | 4/2006 | McDermott et al. | 134/26 |
| 2006/0138399 A1* | 6/2006 | Itano et al. | 257/40 |
| 2006/0199749 A1* | 9/2006 | Suzuki et al. | 510/175 |
| 2007/0049047 A1* | 3/2007 | Fujimoto et al. | 438/759 |
| 2007/0149429 A9* | 6/2007 | Roeder et al. | 510/175 |
| 2007/0238317 A1* | 10/2007 | Allen et al. | 438/778 |
| 2008/0118995 A1* | 5/2008 | Tamboli et al. | 438/4 |
| 2008/0166871 A1* | 7/2008 | Allen et al. | 438/623 |
| 2008/0199977 A1* | 8/2008 | Weigel et al. | 438/4 |
| 2008/0254629 A1* | 10/2008 | Chang et al. | 438/693 |
| 2009/0291873 A1* | 11/2009 | Tamboli | 510/175 |
| 2010/0041234 A1* | 2/2010 | Weigel et al. | 438/694 |

FOREIGN PATENT DOCUMENTS

| | | |
|---|---|---|
| JP | 10-70121 A | 3/1998 |
| JP | 2003-275696 A | 9/2003 |
| JP | 2003-526936 A | 9/2003 |
| JP | 2004-140196 A | 5/2004 |
| WO | WO 00/02241 | 1/2000 |
| WO | 01/68277 A1 | 9/2001 |
| WO | WO 02/07191 A2 | 1/2002 |

OTHER PUBLICATIONS

Yamanishi, T., et al; "Removal of Etching/Ashing Residues and Ashing/Wet-Clean Damage in Porous Silicia Low-K Films"; Microelectronic Engineering 83; 2006; pp. 2142-2145.

Le, Q. T., et al., "Effect of Surfactant as Additive in Wet Clean Solutions on Properties of Low-k Materials", Electrochemical and Solid-State Letters, 9 (4) F17-F21, 2006.

Ishikawa, A., et al., "Influence of CMP Chemicals on the Properties of Porous Silica Low-k Films", Journal of the Electrochemical Society, 153 (7) G692-G696, 2006.

Kondo, S., et al., "Damage-fee CMP towards 32nm-node Porous Low-k (k=1.6)/Cu Integration", Symposium on VLSI Technology Digest of Technical Papers, 2004, 68-69.

Menon, Venue B., et al., "Measurement and Control of Particulate Contaminants", Handbook of Semiconductor Wafer Cleaning Technology, pp. 379-432.

* cited by examiner

METHOD AND COMPOSITION FOR RESTORING DIELECTRIC PROPERTIES OF POROUS DIELECTRIC MATERIALS

BACKGROUND OF THE INVENTION

The present invention relates to a method for restoring the dielectric properties of a porous dielectric material whose dielectric properties have decreased as a result of contamination. In particular, the present invention provides a method for treating a porous low dielectric constant (low-k) material with a restoration fluid to displace entrapped contaminants and substantially restore the dielectric properties of the porous low-k dielectric material.

There is a continuing desire in the microelectronics industry to increase the circuit density in multilevel integrated circuit devices such as memory and logic chips to improve the operating speed and reduce power consumption. In order to continue to reduce the size of devices on integrated circuits, the requirements for preventing capacitative crosstalk between the different levels of metallization becomes increasingly important. These requirements can be summarized by the expression "RC", whereby "R" is the resistance of the conductive line and "C" is the capacitance of the insulating dielectric interlayer. Capacitance "C" is inversely proportional to line spacing and proportional to the dielectric constant (k) of the interlayer dielectric (ILD). Such low dielectric materials (also known as, low-k dielectric materials) are desirable for use, for example, as pre-metal dielectric layers or interlevel dielectric layers. Additionally, low-k dielectric materials are being introduced to replace the conventional dielectrics in high packing density integrated circuits (ICs).

Undoped silica glass ($SiO_2$) subsequently referred to herein as "USG," has been long used in integrated circuits as a primary insulating material because of its relatively lower dielectric constant of approximately 4.0 compared with other inorganic materials. The industry has attempted to produce silica-based materials with lower dielectric constants by incorporating organics or other materials within the silicate lattice. For example, dielectric constants ranging from about 2.7 to about 3.5 can be achieved by incorporating terminal groups such as fluorine or methyl into the silicate lattice. These materials are typically deposited as dense films (having densities of about 1.5 g/cm$^3$) and integrated within the IC device using process steps similar to those for forming USG films; however, there was still a need to produce materials with even lower dielectric constants because transistors need to be placed even closer together to make higher-speed chips. This necessitates that the insulating layer become even thinner, thus leading to charge build-up and crosstalk, which adversely affects the performance of the chip.

Because the dielectric constant of air is nominally 1.0, it was postulated that incorporation of air into the dense material to form pores would result in reducing the dielectric constant as well as the density of the material. For a porous film, the dielectric constant is, thus, a combination of air and the inherent dielectric constant of the material comprising the dense phase. Such combination has the potential to drive the dielectric constant significantly below two.

One method for introducing porosity into a film employs thermal annealing to decompose at least a portion of the film's components thereby creating pores. In the annealing step, or curing step, the film is typically heated to decompose and/or remove volatile components and substantially cross-link the film. U.S. Pat. No. 6,312,793, for example, describes a multiphase material having a first phase consisting essentially of silica (Si), carbon (C), oxygen (O), and hydrogen (H), a second phase consisting of carbon and hydrogen. The material is heated to a temperature of at least 300 degrees Celsius (° C.) for at least 15 minutes to induce removal of the hydrocarbon material.

Another example is found in published International Patent Application WO 00/02241, which describes heating an alkoxysilane material at a temperature from 100° C. to 400° C. for a time of about 1 minute to about 10 minutes to induce formation of pores by removing the solvent contained therein.

Yet another example is found in published International Patent Application WO 02/07191, which describes heating a silica zeolite thin film to a temperature range of 350° C. to 550° C. for an unspecified amount of time to induce adsorbed material to leave the zeolite framework thereby lowering the dielectric constant.

Although the incorporation of pores into dielectric layers is beneficial with respect to the material's insulating properties, there are also drawbacks. One drawback, for example, is that problems can arise when process chemicals and other contaminants penetrate and become entrapped in the pores. When contaminants become entrapped in the pores, the dielectric constant of the material typically increases, thereby reducing the material's dielectric performance.

Typical sources for contamination of porous dielectric materials include, for example, any process step in which a substrate is exposed to liquid process chemicals such as, for example, those used in wet etching, resist stripping, chemical mechanical polishing (CMP), post-CMP cleaning, photolithographic development, etc. Such process chemicals are likely to penetrate the pores in the porous substrate and remain entrapped as a contaminant. Each type of contaminant has a potential for interfering with fabrication processes and adversely affecting the device's dielectric performance such as, for example, increasing the dielectric constant, increasing the leakage current, and reducing the dielectric breakdown voltage. As total elimination of contaminants from process environment is not possible, elaborate methods of semiconductor surface cleaning and conditioning are employed throughout the device manufacturing sequence.

For example, use of a non-porous silicon carbide capping layer on top of the porous dielectric layer was proposed as a means to avoid the direct contact between the porous dielectric layer and the liquid process chemicals. Even if such layer is used, however, there would still be a risk of chemical penetration in the porous dielectric layer either through edges of the films or through a loss of capping layer resulting from mechanical stresses experienced during processing such as, for example, those imparted by CMP.

An apparatus and method of removing contaminants from the voids and pores of a porous dielectric material has also been proposed. The method includes an apparatus comprising a wet-cleaning chamber, a supercritical drying chamber, and a substrate transferring chamber which transfers a substrate to and from the wet-cleaning chamber and supercritical drying chamber. The substrate is cleaned and dried in the wet-cleaning chamber to remove any visible residues and liquids and then subjected to a drying or "microscopic drying" step. This can be done using a supercritical drying chamber using a supercritical fluid under pressure or a low-pressure chamber at high temperatures to remove residual liquids from the voids and pores in the substrate. This method, however, requires special equipment that adds expense and time to a process that manufacturers are trying to reduce costs and streamline operations.

Accordingly, there is a need in the art to provide an improved, cost effective method for restoring the dielectric properties of a contaminated low-k dielectric film that does not suffer from the above-mentions drawbacks.

BRIEF SUMMARY OF THE INVENTION

The present invention satisfies this need by providing a method for restoring dielectric properties of a porous dielectric material. In one aspect, the present invention provides a method for restoring the dielectric properties of a porous dielectric material comprising: providing a substrate comprising at least one layer of a porous dielectric material comprising a contaminant comprising at least one entrapped liquid having a surface tension, wherein the porous dielectric material comprising the at least one contaminant has a first dielectric constant; contacting the substrate with a restoration fluid, wherein the restoration fluid comprises water and at least one component having a surface tension that is less than the surface tension of the at least one entrapped liquid in the at least one layer of a porous dielectric material; and drying the substrate, wherein the porous dielectric material on the dried substrate has a second dielectric constant that is lower than the first dielectric constant and all constituents of the restoration fluid are removed during drying.

In another aspect, the present invention provides a method for restoring the dielectric properties of a porous dielectric material comprising: providing a substrate comprising at least one layer of a porous dielectric material comprising a contaminant comprising at least one entrapped liquid having a surface tension, wherein the porous dielectric material comprising the at least one contaminant has a first dielectric constant; contacting the substrate with a restoration fluid, wherein the restoration fluid comprises 30% by weight or less of isopropyl alcohol and the remainder being water; and drying the substrate, wherein the porous dielectric material on the dried substrate has a second dielectric constant that is lower than the first dielectric constant and all constituents of the restoration fluid are removed during drying.

In yet another aspect, the present invention provides a method for restoring the dielectric properties of a porous dielectric material comprising: providing a substrate comprising at least one layer of a porous dielectric material comprising a contaminant comprising at least one entrapped liquid, the porous dielectric material having a first dielectric constant; contacting the substrate with a restoration fluid, wherein the restoration fluid comprises water and at least one water-soluble organic fluid, and wherein the restoration fluid has a boiling point of from about 30° C. to about 100° C., a surface tension of from about 20 Dynes/cm to about 70 Dynes/cm, thereby displacing the entrapped liquid; and drying the substrate, wherein the dried substrate has a second dielectric constant that is lower than the first dielectric constant and wherein the second dielectric constant is substantially that of the original dielectric constant of the porous material prior to any processing.

DETAILED DESCRIPTION OF THE INVENTION

Figure 1:
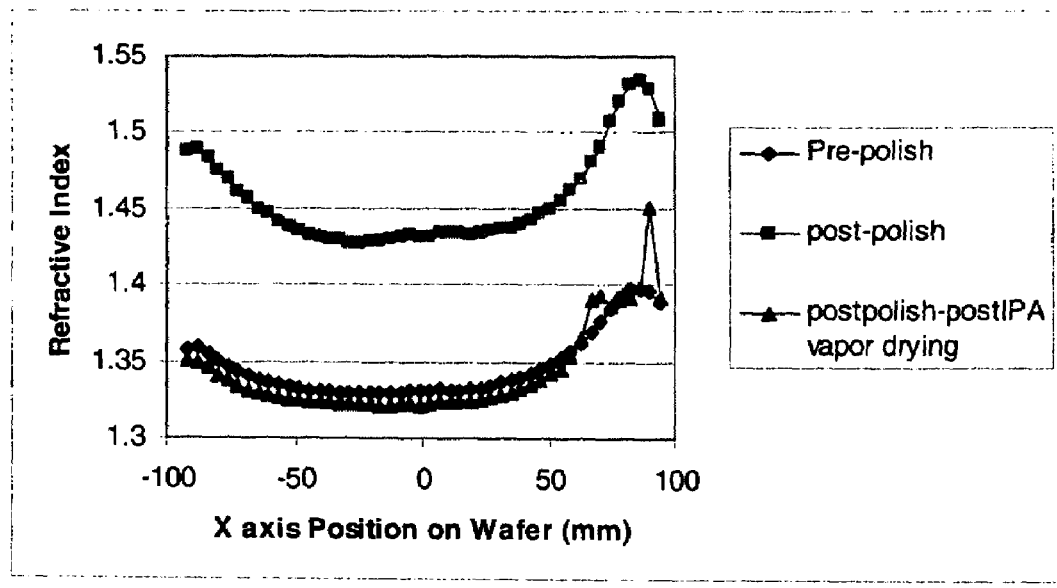
FIG. 1 illustrates the refractive indexes measured at various points along the diameter of a wafer before polishing, after polishing, and after IPA vapor drying.

The present invention provides a method for restoring the dielectric properties of a porous dielectric material whose dielectric properties have suffered as a result of exposure to, for example, process liquids that become entrapped during prior processing steps. Typical process liquids that may contaminate a porous dielectric material include, for example, those used in wet etching, resist stripping, chemical mechanical polishing (CMP), post-CMP cleaning, photolithographic development, etc. Liquid process chemicals are likely to penetrate the pores in the porous substrate and remain entrapped as a contaminant. Each type of contaminant has a potential for interfering with fabrication processes and adversely affecting the device's dielectric performance such as, for example, increasing the dielectric constant, increasing the leakage current, and reducing the dielectric breakdown voltage.

According to the present invention, contaminants can also include metallic particles that are carried by, for example, liquid chemicals and water, as well as from metal parts. Contaminants can also include organic compounds where volatile organic compounds may be present in the air or may be present as a process residue. Native/chemical oxide, although strictly speaking is not a contaminant, if grown in uncontrolled fashion may form particles, which may also be considered a contaminant the removal of which is a desired part of every cleaning sequence.

The present invention provides a method for restoring the dielectric properties of a porous dielectric material comprising: providing a substrate comprising at least one layer of a porous dielectric material comprising a contaminant comprising at least one entrapped liquid having a surface tension, wherein the porous dielectric material comprising the at least one contaminant has a first dielectric constant; contacting the substrate with a restoration fluid, wherein the restoration fluid comprises water and at least one component having a surface tension that is less than the surface tension of the at least one entrapped liquid in the at least one layer of a porous dielectric material; and drying the substrate, wherein the porous dielectric material on the dried substrate has a second dielectric constant that is lower than the first dielectric constant and all constituents of the restoration fluid are removed during drying.

The method of the present invention comprises the step of providing a substrate comprising at least one layer of a porous dielectric material comprising a contaminant comprising at least one entrapped liquid having a surface tension, wherein the porous dielectric material comprising the at least one contaminant has a first dielectric constant. The layer of a porous dielectric material according to the present invention can be a film that is formed onto at least a portion of a substrate. The substrate may be any surface, generated when making an integrated circuit, upon which a conductive layer and/or an insulating (i.e., dielectric) layer may be formed. The substrate thus may include, for example, active and passive devices that are formed on a silicon wafer such as transistors, capacitors, resistors, diffused junctions, gate electrodes, local interconnects, etc.

Suitable substrates for use according to the present invention include, but are not limited to, semiconductor materials such as gallium arsenide (GaAs), indium phosphide (InP), borontride (BN) silicon, and compositions containing silicon such as crystalline silicon, polysilicon, amorphous silicon, epitaxial silicon, silicon dioxide ($SiO_2$), silicon carbide (SiC), silicon oxycarbide (SiOC), silicon nitride (SiN), silicon carbonitride (SiCN), organosilicate glasses (OSG), organofluorosilicate glasses (OFSG), fluorosilicate glasses (FSG), and other appropriate substrates or mixtures thereof. Substrates according to the present invention may further comprise a variety of layers to which the film is applied thereto such as, for example, antireflective coatings, photoresists, organic polymers, porous organic and inorganic materials, metals such as copper and aluminum, or diffusion barrier layers, e.g., TiN, Ti(C)N, TaN, Ta(C)N, Ta, W, WN, or W(C)N.

The layer of porous dielectric material is preferably formed from the deposition of a film-forming composition comprising a compound or compounds that are capable of forming and maintaining an interconnect network. Examples of such films include, but are not limited to, $SiO_2$, organosilicate glass (OSG), fluorinated silicate glass (FSG), boron carbonitride, silicon carbide, hydrogenated silicon carbide, silicon nitride, hydrogenated silicon nitride, silicon carbonitride, hydrogenated silicon carbonitride, boronitride, organic-inorganic composite materials, photoresists, organic polymers, porous organic and inorganic materials and composites, metal oxides such as aluminum oxide, and germanium oxide, diamond-like carbon, borosilicate glass (Si:O:B:H), or phosphorous doped borosilicate glass (Si:O:B:H:P), and combinations thereof.

Preferably, the layer of porous dielectric material comprises a silica material. The term "silica", as used herein, is a material that has silicon (Si) and oxygen (O) atoms, and possibly additional substituents such as, but not limited to, other elements such as C, H, B, N, P, or halide atoms; alkyl groups; or aryl groups. In alternative embodiments, the layer of porous dielectric material may contain, for example, other elements such as, but not limited to, Al, Ti, V, In, Sn, Zn, Ga, and combinations thereof. In certain preferred embodiments, the layer of porous dielectric material may comprise an OSG compound represented by the formula $Si_vO_wC_xH_yF_z$, where $v+w+x+y+z=100$ atomic %, v is from 10 to 35 atomic %, w is from 10 to 65 atomic %, x is from 5 to 30 atomic %, y is from 10 to 50 atomic % and z is from 0 to 15 atomic %.

The layer of porous dielectric material is characterized by the presence of pores. Typically, the pores are formed when the film-forming composition comprises a silica source and at least one porogen that is capable of being easily, and preferably substantially removed upon exposure to one or more energy sources. A "porogen" is a reagent that is used to generate void volume within the resultant film. Regardless of whether or not the porogen is unchanged throughout the inventive process, the term "porogen" as used herein is intended to encompass pore-forming reagents (or pore-forming substituents) and derivatives thereof, in whatever forms they are found. Suitable compounds to be used as the porogen include, but are not limited to, hydrocarbon materials, labile organic groups, solvents, decomposable polymers, surfactants, dendrimers, hyper-branched polymers, polyoxyalkylene compounds, compounds comprising C and H, or combinations thereof. In certain embodiments, the porogen comprises a $C_1$ to $C_{13}$ hydrocarbon compound.

The layer of porous dielectric material is typically formed by exposing the as-deposited composite material from which the layer is made to one or more energy sources to cure the film and/or remove at least a portion of the porogen contained therein. Exemplary energy sources may include, but are not limited to, an ionizing radiation source such as α-particles, β-particles, γ-rays, x-rays, electron beam sources of energy; a nonionizing radiation source such as ultraviolet (10 to 400 nm), visible (400 to 750 nm), infrared (750 to $10^5$ nm), microwave ($>10^6$), and radio-frequency ($>10^6$) wavelengths of energy; or compositions thereof. Still further energy sources include thermal energy and plasma energy. Depending upon the energy source, the exposure step can be conducted under high pressure, atmospheric, or under a vacuum. The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.) or reducing (e.g., dilute or concentrated hydrogen, hydrocarbons (saturated, unsaturated, linear or branched, aromatics), etc.). The temperature for the exposure step may range from about 100 to about 500° C. In certain embodiments, the temperature may be ramped at a rate is from 0.1 to 100 deg ° C./min. The total treatment time is preferably from 0.01 min to 12 hours.

The material from which the layer of porous dielectric material is formed is typically formed as a film onto at least a portion of the substrate from a film-forming composition using a variety of different methods. These methods may be used by themselves or in combination. Some examples of processes that may be used to form the films include the following: thermal chemical vapor deposition, plasma enhanced chemical vapor deposition ("PECVD"), high density PECVD, photon assisted CVD, plasma-photon assisted ("PPECVD"), atomic layer deposition (ALD), cryogenic chemical vapor deposition, chemical assisted vapor deposition, hot-filament chemical vapor deposition, CVD of a liquid polymer precursor, deposition from supercritical fluids, or transport polymerization ("TP"). U.S. Pat. Nos. 6,171,945, 6,054,206, 6,054,379, 6,159,871 and WO 99/41423 provide some exemplary CVD methods that may be used to form the film. Besides chemical vapor deposition processes, other processes that can be used to apply the material from which the porous dielectric layer is made such as, for example, non-contact deposition methods. Non-contact deposition methods typically allow films to be formed without the need of contact masks or shutters. Non-contact deposition methods include, for example, dipping, rolling, brushing, spraying, extrusion, spin-on deposition, air-knife, printing, and combinations thereof. Further exemplary deposition methods include oscillating non-contact induced spreading forces, gravity-induced spreading forces, wetting-induced spreading forces, slot extrusion, and combinations thereof.

Examples of materials and processes suitable for use in forming the layer of porous dielectric material of the present invention are found in U.S. patent application Publication Nos. 2004/0175501 A1 and 2004/0096672 A1, the disclosures of which are incorporated herein by reference in their entirety and assigned to the assignee of the present application. Preferably, such low-k materials have a dielectric constant of about 4.0 or less, more preferably about 3.0 or less, and most preferably about 2.0 or less.

As stated above, the dielectric properties of a porous dielectric material can suffer by exposure to, for example, process liquids that become entrapped during prior processing steps. As used herein, the term "entrapped liquid" includes the liquids themselves and/or residual components of the liquid that may have dried such as, for example, organic surfactant compounds or other types of organic compounds that may be present in process liquids such as, for example, used in the manufacture of semiconductors. Examples of such process liquids that may become entrapped and contaminate a porous dielectric material include, for example, those used in wet etching, resist stripping, chemical mechanical polishing (CMP), post-CMP cleaning, photolithographic development, etc. Such liquid process chemicals penetrate the pores in the porous substrate and become entrapped contaminants by, for example, mechanical forces and capillary forces due to the surface tension of the process liquid. Regarding the latter, wetting ability of a liquid is a function of the surface energies of the solid-liquid interface (i.e., the pore-process liquid interface).

A process liquid's wetting characteristics are typically responsible for its ability to fill a void such as, for example, a pore. Process liquids are often pulled into surface breaking defects by capillary action. The capillary force driving the penetrant into the pore is a function of the surface tension of the liquid-gas interface, the contact angle, and the size of the pore. The driving force for the capillary action can be expressed as the following formula:

$$\text{Force} = 2\pi r \sigma_{LG} \cos\theta$$

Where:
r=radius of the crack opening ($2\pi$ r is the line of contact between the liquid and the solid tubular surface.)
$\sigma_{LG}$=liquid-gas surface tension
$\theta$=contact angle Since pressure is the force over a given area, it can be written that the pressure developed, called the capillary pressure, is $$\text{Capillary Pressure} = (2\sigma_{LG} \cos\theta)/r$$

The above equations are for a cylindrical-type pore but the relationships of the variables are the same for a pore with a noncircular cross section. Capillary pressure equations only apply when there is simultaneous contact of the process liquid along the entire length of the pore and a liquid front forms that is an equidistant from the surface. A process liquid's surface could assume a complex shape as a consequence of the various pore sizes and shapes. In this case, the expression for pressure is $$\text{Capillary Pressure} = 2(\sigma_{SG} - \sigma_{LG})/r = 2\Sigma/r$$

Where:
$\sigma_{SG}$=the surface energy at the solid-gas interface.
$\sigma_{LG}$=the surface energy at the solid-liquid interface.
r=the radius of the opening.
$\Sigma$=the adhesion tension ($\sigma_{SG} - \sigma_{SL}$).

Therefore, at times, it is the adhesion tension that is primarily responsible for a process liquid's movement into a pore and not the surface energy of the liquid-gas interface. Adhesion tension is the force acting on a unit length of the wetting line from the direction of the solid. The wetting performance of the penetrant is degraded when adhesion tension is the primary driving force.

It can be seen from the equations that the surface wetting characteristics of the process liquids (defined by the surface energies) are important characteristics in contaminating a porous substrate. The process liquid will continue to fill the pore until an opposing force balances the capillary pressure or the pores are completely filled.

Typical process liquids that result in the contamination of the porous dielectric material are those liquids that are typically used in wet-chemical processing during the manufacturing of a semiconductor and, thus, would be known to those of ordinary skill in the art. Typical process liquids include, for example, photoresist strippers, post ash and post-etch residue removers, CMP slurries, and post-CMP cleaning solutions. These process liquids typically have a surface tension in the range of about 25 to about 50 Dynes/cm and may contain a surface tension modifier such as, for example, a wetting agent.

As a result of contamination by such process liquids, the dielectric constant of the porous dielectric material may increase, for example, as much as 50% from its original, i.e., inherent, value depending upon the nature of the process liquid and the amount of time in which the porous dielectric material is exposed to the process liquid. The increase in dielectric constant as a result of such contamination is herein referred to as the 'first dielectric constant'.

The method of the present invention also includes the step of contacting the substrate with a restoration fluid having a surface tension that is less than the surface tension of the at least one entrapped liquid in the at least one layer of a porous dielectric material. As used herein, the term "restoration fluid" includes any fluid as described below that, when contacted with a contaminated porous dielectric material will at least partially remove at least one contaminant, thereby lowering the material's dielectric constant. As such, the restoration fluid functions to remove the contaminants, thereby restoring the dielectric constant and other dielectric properties of the porous dielectric material. The removal of such contaminants according to the present invention may be accomplished in part or in whole by, for example, displacement or solubilization mechanisms.

Preferably, the restoration fluid has a surface tension less than that of the process liquid contaminant, a high vapor pressure, and a low viscosity.

A restoration fluid according to the present invention comprises water and at least one component that has a surface tension lower than that of the process liquid contaminant because a fluid having a lower surface tension relative to another will typically displace the fluid having a higher surface tension. Preferably, the surface tension of the restoration fluid is from about 20 and about 70 Dynes/cm, more preferably from about 20 and about 60 Dynes/cm, and, most preferably, below about 50 Dynes/cm.

A restoration fluid according to the present invention preferably has a high vapor pressure so it readily evaporates after contact with the porous dielectric material thereby leaving behind a clean surface that is easy to dry. Preferably, the boiling point of the restoration fluid is from about 30° C. to about 100° C., more preferably from about 40° C. to about 100° C., and, most preferably, lower than 90° C.

In the present invention, water functions in various ways such as, for example, to dissolve one or more solid components of the composition, as a carrier of the components, as an aid in the removal of the residue, as a viscosity modifier of the composition, and as a diluent. Preferably, the water employed in the cleaning composition is de-ionized (DI) water.

It is believed that, for most applications, water will comprise, for example, from about 1 to about 99% by wt. of water. Other preferred embodiments of the present invention could comprise from about 10 to about 90% by wt. of water. Yet other preferred embodiments of the present invention could comprise from about 30 to about 60% by wt. of water. Still other preferred embodiments of the present invention could comprise about 50% by wt. of water. Still other preferred embodiments of the present invention could include water in an amount to achieve the desired weight percent of the other components.

The restoration fluid according to the present invention also comprises at least one component that has a surface tension lower than that of the process liquid contaminant. Examples of such components that are suitable for use as the at least one component that has a surface tension lower than that of the process liquid contaminant include, for example, water-soluble organic fluids. As used herein, the term "water-soluble" with respect to the water-soluble organic fluids means that such organic fluids are sufficiently soluble in water to result in a concentration of at least 1% by weight of the organic fluid in the solution. Such water-soluble organic fluids suitable for use as a component of a restoration fluid according to the present invention include, for example, isopropyl alcohol (IPA), acetone, acetonitrile, ethyl acetate, tetrahydrofuran, methanol, diethyl-ether, and mixtures thereof. The surface tension and boiling point of these fluids are listed in Table 1.

TABLE 1

| Restoration Fluid | Surface Tension @ 20° C. (dynes/cm) | Boiling Point (° C.) |
| --- | --- | --- |
| Isopropyl Alcohol | 21.7 | 82.4 |
| Acetone | 23.7 | 56.5 |
| Acetonitrile | 29.3 | 81.6 |
| Ethyl acetate | 32.5 | 77.0 |
| Methanol | 22.6 | 64.7 |
| Tetrahydrofuran | 26.4 | 65.0 |
| Diethyl-ether | 18.9 | 34.6 |

The restoration fluid according to the present invention may contain one or more of such components in addition to water. The amounts of each component may vary according to performance requirements.

In preferred embodiments of the present invention, the restoration fluid comprises isopropyl alcohol. For example, in one preferred embodiment of the present invention, the restoration fluid comprises less than 30% by weight of isopropyl alcohol, with the remainder being water. In another preferred embodiment, the restoration fluid comprises 25% by weight or less of isopropyl alcohol, with the remainder being water. In another preferred embodiment, the restoration fluid comprises 20% by weight or less of isopropyl alcohol, with the remainder being water. In another preferred embodiment, the restoration fluid comprises 15% by weight or less of isopropyl alcohol, with the remainder being water. In yet another preferred embodiment, the restoration fluid comprises 10% by weight or less of isopropyl alcohol, with the remainder being water. In still yet another preferred embodiment, the restoration fluid comprises 5% by weight or less of isopropyl alcohol, with the remainder being water. Preferably, the water employed in the present invention is de-ionized (DI) water.

The contacting step according to the method of the present invention can be carried out by any suitable means of contacting a substrate with a fluid known to those skilled in the art. The contacting step can be carried out, for example, by immersion, RCA methods, spray, or via a single wafer process—either in batch or individual processes.

In one embodiment of the present invention, a contaminated porous material is contacted by immersion with a restoration fluid in an immersion tank such as, for example, those produced by Santa Clara Plastics, Submicron Systems, Semifab, Sankho Engineering, and Dai Nippon. The immersion tank can also be a closed system apparatus such as that made by CFM Technologies Inc. In such systems, the immersion time is preferably from about 10 seconds to about 5 minutes, more preferably from about 30 seconds to about 3 minutes and, most preferably from about 30 seconds to about 1 minute. Optionally, a megasonics transducer or other ultrasonic device can be used in the immersion tank to help remove any contaminants that are present on the material.

In yet another embodiment, the restoration fluid can be applied to a contaminated porous dielectric material with a brush scrubber such as, for example, those used in post-CMP cleaning procedures. The scrubbing action of the brush can aid in the removal of the contaminants further restoring the dielectric properties of the dielectric material.

In yet another embodiment, the contaminated porous material can be exposed to the vapors of a restoration fluid wherein the vapors can penetrate into the pores and condense inside thereby forming a liquid. The condensed liquid may then displace any contaminant inside the pores to restore the material's dielectric properties.

In still yet another embodiment, the contaminated porous material can be sprayed with the restoration fluid at pressures wherein the restoration fluid can penetrate into the pores. The restoration fluid can then displace any contaminant inside the pores to restore the material's dielectric properties. Spray processors are well known to those skilled in the art.

Without intending to be bound by any particular theory, it is believed that during the contacting step the restoration fluid functions as described herein. The at least one component having a surface tension less than the surface tension of the at least one entrapped liquid displaces the at least one entrapped liquid from the surface of the pore. After displacement, the restoration fluid—as a whole or at least one component of it—may solubilize the entrapped liquid but, in any event, will carry it away from the pore and into the bulk of the fluid.

The method of the present invention also includes the step of drying the substrate, wherein the porous dielectric material on the dried substrate has a second dielectric constant that is lower than the first dielectric constant. The drying step is carried out by any suitable means, for example, evaporation by applying heat or by centripetal force, by flowing a dry inert gas over the substrate, spin-rinse-drying, isopropyl alcohol vapor drying, or by Maragoni drying. In preferred embodiments of the present invention, all constituents of the restoration fluid are removed during drying.

Dielectric constants of the films of the present invention can be measured by any means known to those skilled in the art. For example, it is well known to those skilled in the art that the dielectric properties of the interlayer dielectric can be assessed by measuring the refractive index of the film. A refractive index measurement is a fast, non-destructive method of determining changes in dielectric properties. Correlation between dielectric constant and refractive index of a material is fully described in, for example, the publication *Principles of Optics—Electromagnetic Theory of Propogation, Interference and Diffraction of Light* by Max Born and Emil Wolf, Seventh (Expanded) Edition, Cambridge University Press (1999), at pages 11 to 14.

The porous dielectric material can be further subjected to an optional thermal treatment step wherein the material can be heated to temperatures of from about 100° C. to about 500° C. in an inert environment or under vacuum conditions and preferably heated to from about 100° C. to about 300° C. The optional thermal treatment step functions to remove any residual liquid from the pores.

The porous dielectric material upon completion of the drying step (and the optional thermal treatment step) has a second dielectric constant that is lower than the first dielectric constant. The "second" dielectric constant is preferably at least partially restored relative to the first dielectric constant, which, in turn, is higher than the porous dielectric material's inherent dielectric constant. Preferably, the second dielectric constant is restored to at least about 10% of the porous dielectric material's inherent dielectric constant. More Preferably, the second dielectric constant is restored to at least about 5% of the porous dielectric material's inherent dielectric constant. Most preferably, the second dielectric constant is restored to at least about 3% of the porous dielectric material's inherent dielectric constant.

In another embodiment, the present invention provides a method for restoring the dielectric properties of a porous dielectric material comprising providing a substrate comprising at least one layer of a porous dielectric material comprising a contaminant comprising at least one entrapped liquid, the porous dielectric material having a first dielectric constant; contacting the substrate with a restoration fluid, wherein the restoration fluid comprises water and at least one water-soluble organic fluid, and wherein the restoration fluid has a boiling point of from about 40° C. to about 100° C., and a surface tension of from about 20 dynes to about 70 dynes, thereby displacing the entrapped liquid; and drying the substrate, wherein the dried substrate has a second dielectric constant that is lower than the first dielectric constant and wherein the second dielectric constant is substantially that of the original dielectric constant of the porous material prior to any processing.

Additional objects, advantages, and novel features of this invention will become apparent to those skilled in the art upon examination of the following examples thereof, which are not intended to be limiting.

EXAMPLES

The following examples were performed on a porous low dielectric constant film PDEMS (Trademark registered by Air Products & Chemicals (APCI), Allentown, Pa.) having a film thickness of 5000 Angstrom (Å).

Effect of a Low Surface Tension Liquid on Restoring Dielectric Properties

A cleaning solution of Coppeready™ CP72B (Air Products and Chemicals, Inc., Allentown, Pa.) was diluted with DI water in the ratio 20 times by volume of water to one part by volume of Coppeready™ CP72B. Pieces of the wafer were immersed in the cleaning solution for 5 minutes. The pieces were then rinsed with DI water and then blow dried with nitrogen gas and the refractive index was measured. The pieces were then immersed in a 3.92 percent by weight IPA-water solutions for 1 minute. As seen in Table 2, the dielectric property of the porous material was almost restored to its original value after being finally contacted with a solution of isopropyl alcohol.

TABLE 2

| | Refractive index |
|---|---|
| Original Value | 1.358 |
| After immersion in CP72B | 1.493 |
| After immersion in CP72B followed by immersion in 5 vol % IPA | 1.391 |

Restoration of Dielectric Properties Through IPA Vapor Drying

A wafer with PDEMS film was polished on IPEC 472 polisher using Coppeready™ CP4121 (Air Products and Chemicals, Inc., Allentown, Pa.) slurry. The polishing was performed for 30 seconds at 1.5 pounds per square inch (psi) downforce, 90 revolutions per minute (RPM) table speed and 150 milliliter per minute (ml/min) slurry flow rate. Politex pad was used for polishing. After the polishing, the wafer was spin-rinse-dried in Semitool spin rinse drier. This film was subsequently exposed to IPA vapor in an IPA vapor drier made by SK International (Upper Darby, Pa., 19082). The IPA bath temperature was maintained at 190° C. Total exposure time to IPA vapor was 9 minutes. FIG. 1 is a graph of the refractive index measured on various points along the diameter of the wafer before polishing, after polishing and after IPA vapor drying. It is evident from FIG. 1 that the dielectric properties can be restored with IPA vapor drying.

Effect of IPA Concentration on Dielectric Property Restoration

Pieces of a PDEMS™ film having a dielectric constant of about 2.5 were measured for their initial refractive index. Some films were then immersed in a Coppeready™ CP72B cleaning solution (diluted 20:1 with DI water) for 1 minute and some films were immersed for 5 minutes. The refractive index was measured after rinsing with DI water and after blow-drying with nitrogen. The films were then immersed in IPA-water solutions containing varying concentrations of IPA. Tables 3 and 4 tabulate the refractive index changes in the PDEMS™ films as a result of these processing steps. % Recovery was calculated as % Recovery in refractive index= (Refractive index after CP72b Immersion−Refractive index after IPA immersion)*100/(Refractive index after CP72B Immersion−Initial Refractive index of the untreated film).

TABLE 3

| IPA Conc. (vol %) | Pre-immersion Refractive index | Post-CP72B (20:1) immersion for 1 minute | Post IPA immersion | % Recovery in Refractive index |
|---|---|---|---|---|
| 0.0 | 1.3663 | 1.3804 | 1.3791 | 9.4 |
| 0.5 | 1.3672 | 1.3836 | 1.3792 | 27.1 |
| 1.0 | 1.3597 | 1.3773 | 1.3741 | 18.3 |
| 2.5 | 1.3606 | 1.3722 | 1.3703 | 16.2 |
| 5.0 | 1.3628 | 1.3785 | 1.3714 | 45.3 |
| 10.0 | 1.3647 | 1.3768 | 1.3652 | 95.3 |
| 20.0 | 1.3701 | 1.3839 | 1.3733 | 76.9 |
| 30.0 | 1.3630 | 1.3746 | 1.3609 | 118.7 |
| 50.0 | 1.3695 | 1.3803 | 1.3643 | 147.7 |
| 75.0 | 1.3634 | 1.3760 | 1.3588 | 137.3 |
| 100.0 | 1.3634 | 1.3741 | 1.3578 | 153.3 |

TABLE 4

| IPA Conc. (vol %) | Pre-immersion Refractive index | Post-CP72B (20:1) immersion for 5 minute | Post IPA immersion | % Recovery in Refractive index |
|---|---|---|---|---|
| 0.0 | 1.3606 | 1.4164 | 1.4048 | 20.9 |
| 0.5 | 1.3673 | 1.4172 | 1.4044 | 25.6 |
| 1.0 | 1.3633 | 1.4174 | 1.3974 | 36.9 |
| 2.5 | 1.3645 | 1.4122 | 1.3814 | 64.6 |
| 5.0 | 1.3663 | 1.4057 | 1.3793 | 67.0 |
| 10.0 | 1.3562 | 1.3966 | 1.3684 | 69.7 |
| 20.0 | 1.3617 | 1.4190 | 1.3631 | 97.5 |
| 30.0 | 1.3606 | 1.4189 | 1.3635 | 94.9 |
| 50.0 | 1.3654 | 1.4126 | 1.3586 | 114.2 |
| 100.0 | 1.3675 | 1.4059 | 1.3668 | 101.8 |

Figure 2:
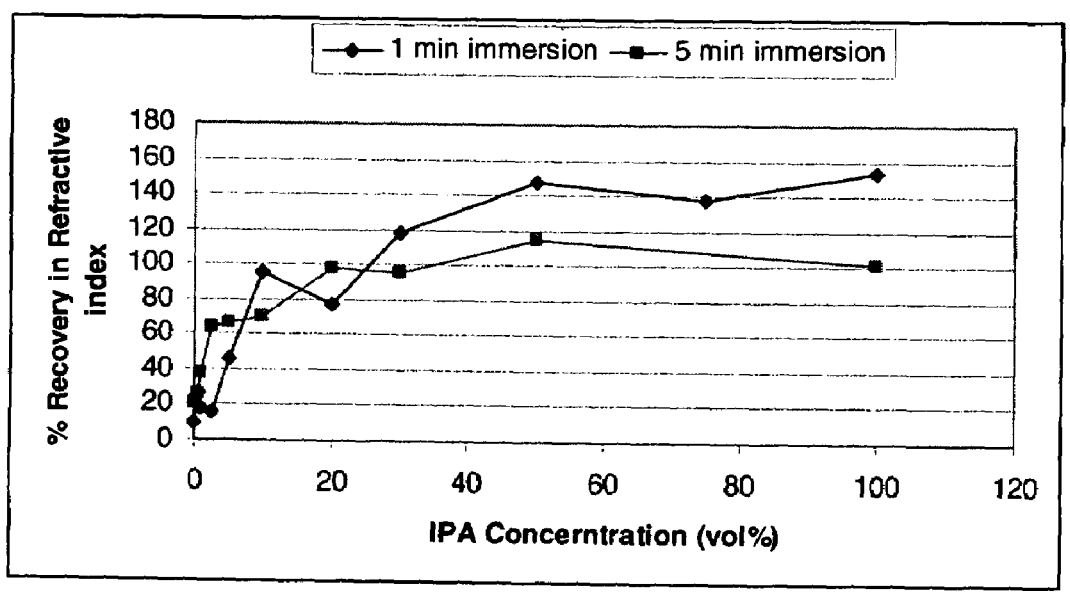
FIG. 2 is a plot of refractive index recovery using compositions of varied concentrations of IPA after the immersion in a cleaning solution for 1 and 5 minutes

FIG. 2 is a plot of the refractive index recovery using IPA the above solutions having varied IPA concentrations after the immersion in Coppeready™ CP72B for 1 and 5 min exposure times. From the data plotted in FIG. 2, it is evident that as much as 50% of the dielectric constant can be recovered using a restoration fluid having a concentration of only 5.0% IPA. 100% recovery of the dielectric constant can be obtained by employing a restoration fluid having a concentration of IPA of as little as 25%.

Effect of a Various Restoration Fluids on Restoring Dielectric Properties

A cleaning solution of Coppeready™ CP72B (Air Products and Chemicals, Inc., Allentown, Pa.) was diluted with DI water in the ratio 20 times by volume of water to one part by volume of Coppeready™ CP72B. Pieces of a wafer comprising a layer of PDEMS® low dielectric constant material (Air Products and Chemicals, Inc., Allentown, Pa.) were immersed in the cleaning solution for 5 minutes. The pieces were then rinsed with DI water and then blow dried with nitrogen gas and the refractive index was measured. The pieces were then separately immersed for one minute in a restoration fluid comprising acetone, a restoration fluid comprising THF, and a restoration fluid comprising ethyl acetate to compare the restoration effect on the dielectric constant. Tables 5 and 6 illustrate that substantial restoration of the refractive index and the dielectric constant was achieved with the solvents tested.

TABLE 5

| | Restoration Fluid | | |
|---|---|---|---|
| PDEMS ® 2.5 Dielectric | 50/50 Acetone/water R.I. | 50/50 THF/water R.I. | 6/94 Ethyl acetate/water R.I. |
| Before Immersion | 1.3529 | 1.3584 | 1.3561 |
| After CP72B (20:1) 5 min | 1.3959 | 1.4111 | 1.3979 |
| After immersion in restoration fluid for 1 min | 1.3505 | 1.3614 | 1.3587 |
| % recovery of refractive index | 105.6 | 94.2 | 93.8 |

TABLE 6

| | Restoration Fluid | | |
|---|---|---|---|
| PDEMS ® 2.5 Dielectric | 50/50 Acetone/water Dielectric constant | 50/50 THF/water Dielectric constant | 6/94 Ethyl acetate/water Dielectric constant |
| Before Immersion | 2.50 | 2.50 | 2.50 |
| After CP72B (20:1) 5 min | 3.47 | 3.15 | 3.09 |
| After immersion in restoration fluid for 1 min | 2.60 | 2.62 | 2.56 |
| % recovery of dielectric constant | 89.7 | 81.5 | 89.8 |

The following examples were performed on porous low dielectric constant MesoElk® Films (Trademark registered by Air Products & Chemicals (APCI), Allentown, Pa.) having an dielectric constant of 2.2 and film thickness of 4750 Angstrom (Å).

Effect of Restoration Fluid on Restoring Dielectric Properties of MesoElk® Films A cleaning solution of Coppeready™ CP72B (Air Products and Chemicals, Inc., Allentown, Pa.) was diluted with DI water in the ratio 20 times by volume of water to one part by volume of Coppeready™ CP72B. Pieces of a wafer comprising a layer of MesoElk® porous organosilicate glass (Air Products and Chemicals, Inc., Allentown, Pa.) were immersed in the cleaning solution for 5 minutes. The pieces were then rinsed with DI water and then blow dried with nitrogen gas and the refractive index was measured. The pieces were then separately immersed for one minute in restoration fluids comprising various amounts of IPA. Table 7 illustrates that substantial restoration of the refractive index and, thus, the dielectric constant was achieved.

TABLE 7

| | Restoration Fluid | | |
|---|---|---|---|
| MesoElk | 10/90 IPA/water R.I. | 20/80 IPA/water R.I. | 30/70 IPA/water R.I. |
| Before Immersion | 1.2407 | 1.2382 | 1.2410 |
| After CP72B (20:1) 5 min | 1.2876 | 1.2916 | 1.2860 |
| After immersion in restoration fluid for 1 min | 1.2454 | 1.2419 | 1.2426 |
| % recovery of refractive index | 89.8 | 93.1 | 96.4 |

Figure 3:
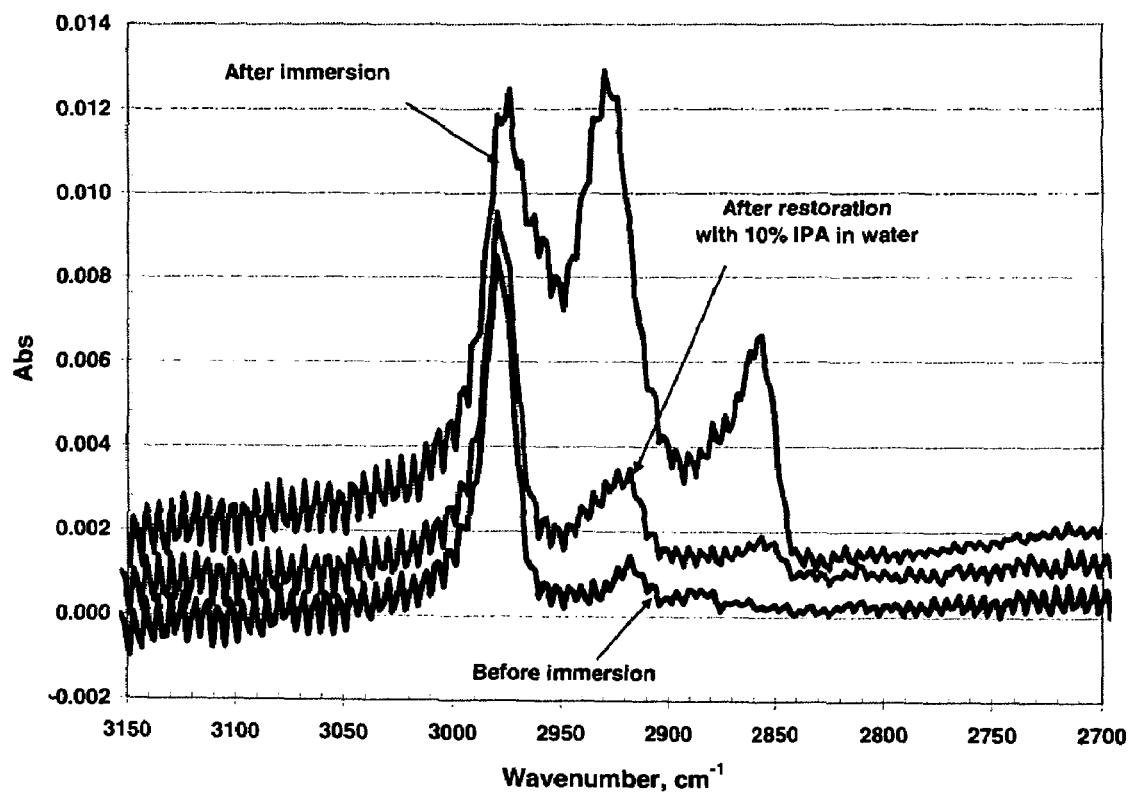
FIG. 3 is an FTIR spectrum that illustrates the effect of the present invention.
Figure 4:
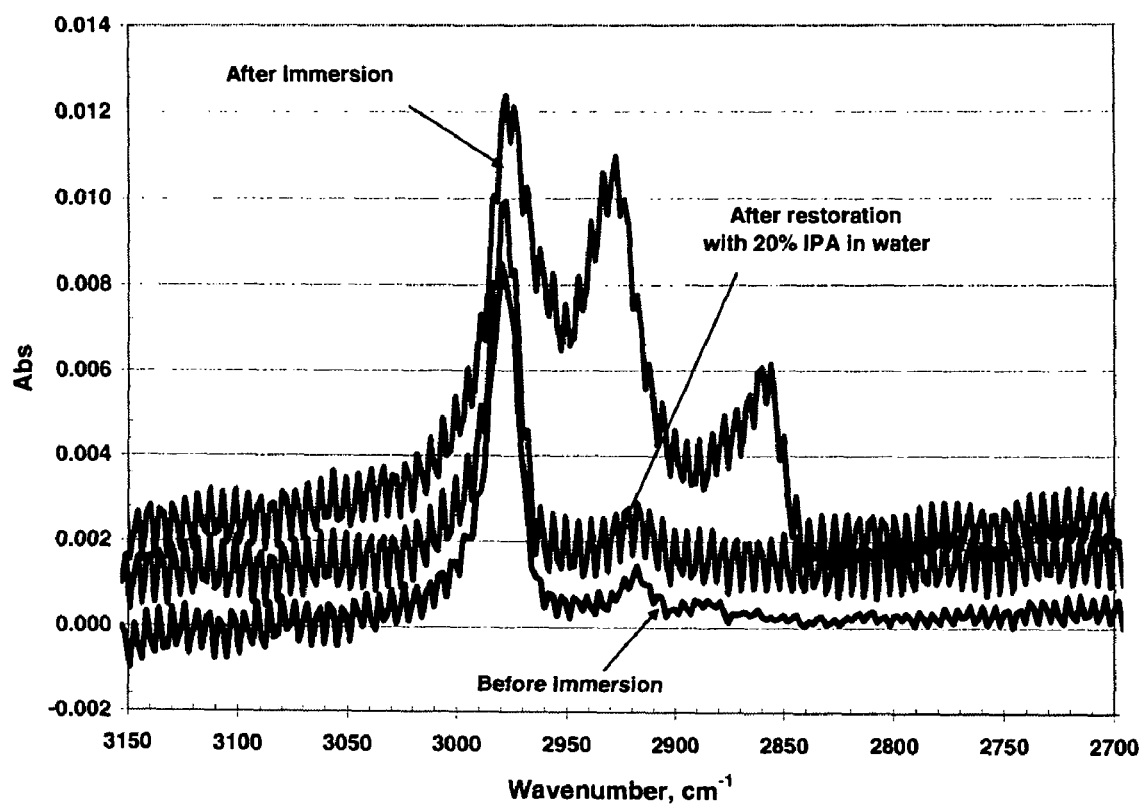
FIG. 4 is an FTIR spectrum that illustrates the effect of the present invention.
Figure 5:
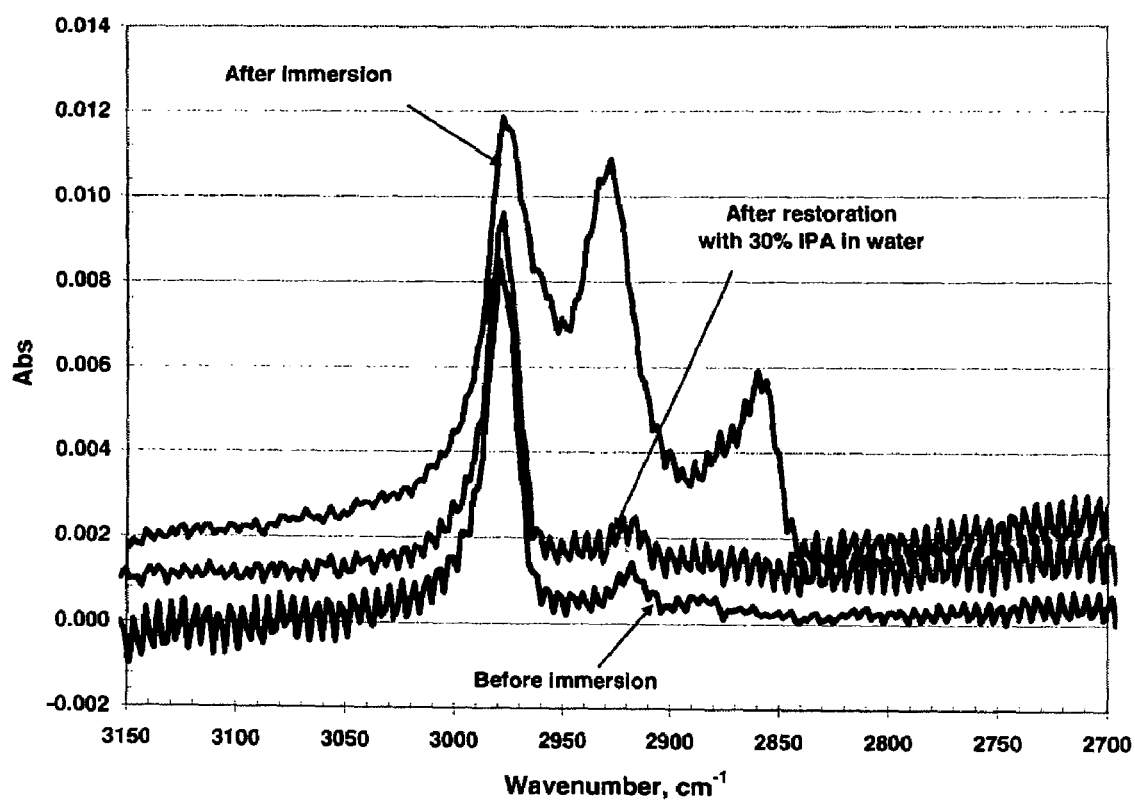
FIG. 5 is an FTIR spectrum that illustrates the effect of the present invention.

FIGS. 3, 4 and 5 are IR spectra of the MesoElk® layers before and after treatment with each of the 10, 20 and 30% IPA restoration fluids, respectively. Significantly, a substantial reduction of the band at 2920 cm$^{-1}$ and 2860 cm$^{-1}$ is observed upon treatment.

The foregoing examples and description of the embodiments should be taken as illustrating, rather than as limiting the present invention as defined by the claims. As will be readily appreciated, numerous variations and combinations of the features set forth above can be utilized without departing from the present invention as set forth in the claims. Such variations are intended to be included within the scope of the following claims.

We claim:

1. A method for restoring the dielectric properties of a porous dielectric material consisting essential of:
   providing a substrate comprising at least one layer of a porous dielectric material comprising a contaminant comprising at least one entrapped liquid having a surface tension, wherein the porous dielectric material comprising the at least one contaminant has a first dielectric constant;
   contacting the substrate with a restoration fluid, wherein the restoration fluid comprises water and at least one component having a surface tension that is less than the surface tension of the at least one entrapped liquid in the at least one layer of a porous dielectric material; and
   drying the substrate, wherein the porous dielectric material on the dried substrate has a second dielectric constant that is lower than the first dielectric constant and all constituents of the restoration fluid are removed during drying.

2. The method of claim 1 wherein the porous dielectric material has a dielectric constant of about 4.0 or less.

3. The method of claim 1 wherein the surface tension of the at least one entrapped liquid is from about 25 to about 50 Dynes/cm.

4. The method of claim 1 wherein the surface tension of the restoration fluid is from about 20 to about 70 Dynes/cm.

5. The method of claim 4 wherein the restoration fluid has a boiling point of from about 30° C. to about 100° C.

6. The method of claim 1 wherein the at least one component is selected from the group consisting of isopropyl alcohol, acetone, acetonitrile, ethyl acetate, tetrahydrofuran, methanol, diethyl-ether, and mixtures thereof.

7. The method of claim 1 wherein the restoration fluid comprises less than 30% by weight of isopropyl alcohol.

8. The method of claim 7 wherein the restoration fluid comprises 25% by weight or less of isopropyl alcohol.

9. The method of claim 8 wherein the restoration fluid comprises 20% by weight or less of isopropyl alcohol.

10. The method of claim 9 wherein the restoration fluid comprises 15% by weight or less of isopropyl alcohol.

11. The method of claim 10 wherein the restoration fluid comprises 10% by weight or less of isopropyl alcohol.

12. The method of claim 11 wherein the restoration fluid comprises 5% by weight or less of isopropyl alcohol.

13. The method of claim 1 wherein the restoration fluid is selected from the group consisting of: a mixture of 50% water and 50% acetone, a mixture of 50% water and 50% THF, and a mixture of 50% water and 50% ethyl acetate.

14. The method of claim 1 wherein the porous dielectric material is contacted with the restoration fluid in an immersion tank.

15. The method of claim 1 wherein the porous dielectric material is contacted with the restoration fluid by use of a brush scrubber.

* * * * *